(12) United States Patent
Takachi et al.

(10) Patent No.: US 9,041,161 B2
(45) Date of Patent: May 26, 2015

(54) SEMICONDUCTOR DEVICE WITH A CHIP PREVENTION MEMBER

(71) Applicant: Sony Corporation, Tokyo (JP)

(72) Inventors: Taizo Takachi, Kanagawa (JP); Satoru Wakiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/945,161

(22) Filed: Jul. 18, 2013

(65) Prior Publication Data

US 2014/0061865 A1  Mar. 6, 2014

(30) Foreign Application Priority Data

Aug. 28, 2012 (JP) ................................. 2012-187927

(51) Int. Cl.

| | | |
|---|---|---|
| *H01L 23/544* | (2006.01) | |
| *H01L 23/48* | (2006.01) | |
| *H01L 23/52* | (2006.01) | |
| *H01L 29/40* | (2006.01) | |
| *H01L 23/04* | (2006.01) | |
| *H01L 29/06* | (2006.01) | |
| *H01L 33/00* | (2010.01) | |
| *H01L 21/78* | (2006.01) | |
| *H01L 27/146* | (2006.01) | |
| *H01L 23/00* | (2006.01) | |
| *H01L 23/31* | (2006.01) | |

(52) U.S. Cl.
CPC .............. *H01L 23/544* (2013.01); *H01L 21/78* (2013.01); *H01L 23/562* (2013.01); *H01L 23/3114* (2013.01); *H01L 24/94* (2013.01); *H01L 27/146* (2013.01)

(58) Field of Classification Search
USPC ............. 257/620, 774, 698, 621, 98, 99, 618, 257/619
See application file for complete search history.

(56) References Cited

U.S. PATENT DOCUMENTS

2011/0169159 A1*  7/2011  Lin et al. ........................ 257/692

FOREIGN PATENT DOCUMENTS

JP    2008-066679    3/2008

* cited by examiner

*Primary Examiner* — A. Sefer
*Assistant Examiner* — Dilinh Nguyen
(74) *Attorney, Agent, or Firm* — Fishman Stewart Yamaguchi PLLC

(57) ABSTRACT

There is provided a semiconductor device including a semiconductor layer, a protective layer including a transparent material, and a transparent resin layer that seals a gap between the semiconductor layer and the protective layer. A chip prevention member with a higher Young's modulus than the transparent resin layer is formed to come into contact with the semiconductor layer in a dicing portion of a layer structure before fragmentation, and dicing is performed in the dicing portion for the fragmentation.

9 Claims, 13 Drawing Sheets

2··· SEMICONDUCTOR LAYER
4··· PROTECTIVE LAYER
5··· TRANSPARENT RESIN LAYER
6··· CHIP PREVENTION MEMBER

2··· SEMICONDUCTOR LAYER
4··· PROTECTIVE LAYER
5··· TRANSPARENT RESIN LAYER
6··· CHIP PREVENTION MEMBER

2 ··· SEMICONDUCTOR LAYER
4 ··· PROTECTIVE LAYER
5 ··· TRANSPARENT RESIN LAYER
6 ··· CHIP PREVENTION MEMBER

FIG. 6
2 ··· SEMICONDUCTOR LAYER
4 ··· PROTECTIVE LAYER
5 ··· TRANSPARENT RESIN LAYER
6 ··· CHIP PREVENTION MEMBER
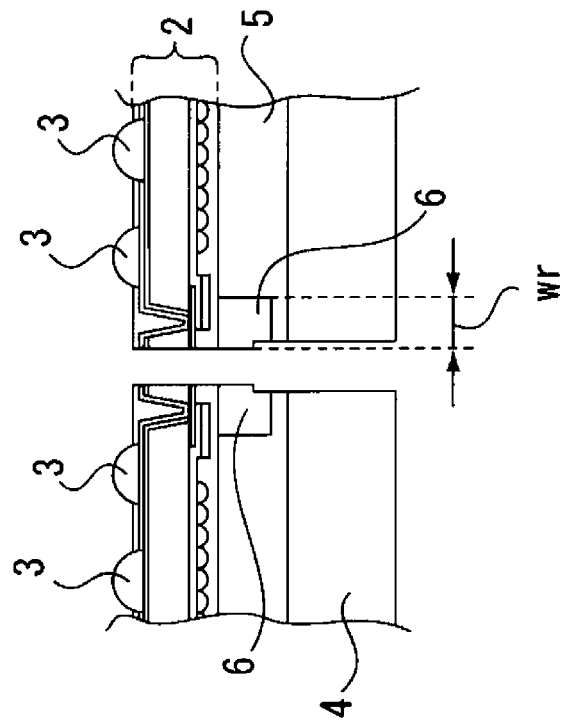
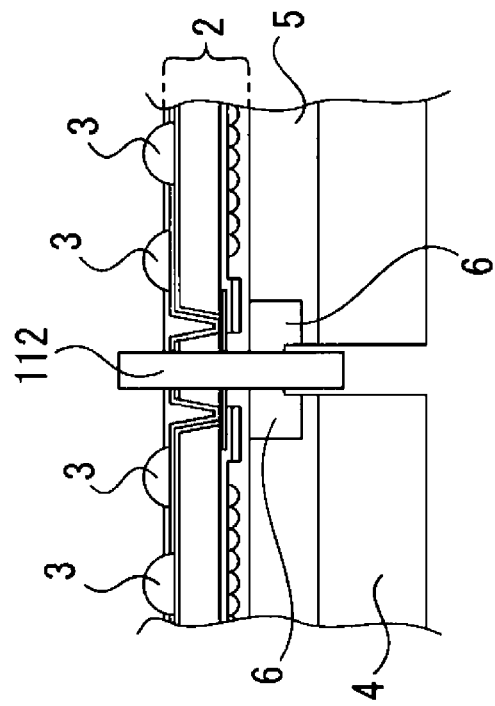

2··· SEMICONDUCTOR LAYER
4··· PROTECTIVE LAYER
5··· TRANSPARENT RESIN LAYER
6··· CHIP PREVENTION MEMBER

2 ··· SEMICONDUCTOR LAYER
4 ··· PROTECTIVE LAYER
5 ··· TRANSPARENT RESIN LAYER
6 ··· CHIP PREVENTION MEMBER

1 ··· SEMICONDUCTOR DEVICE

FIG. 13
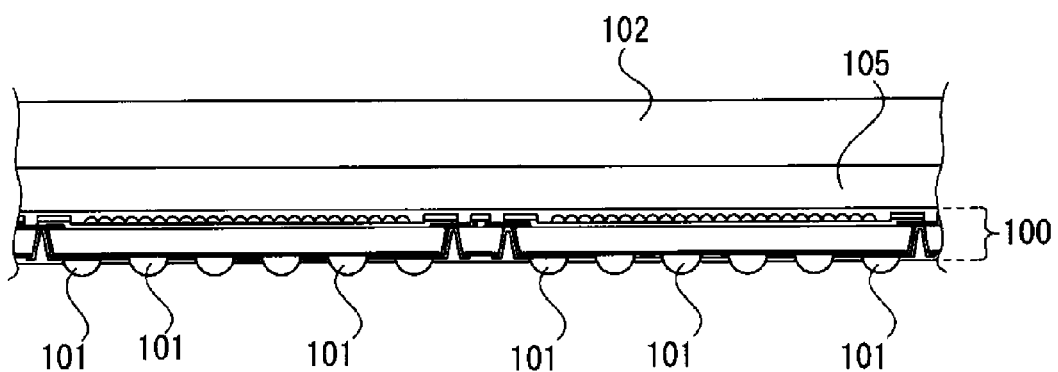
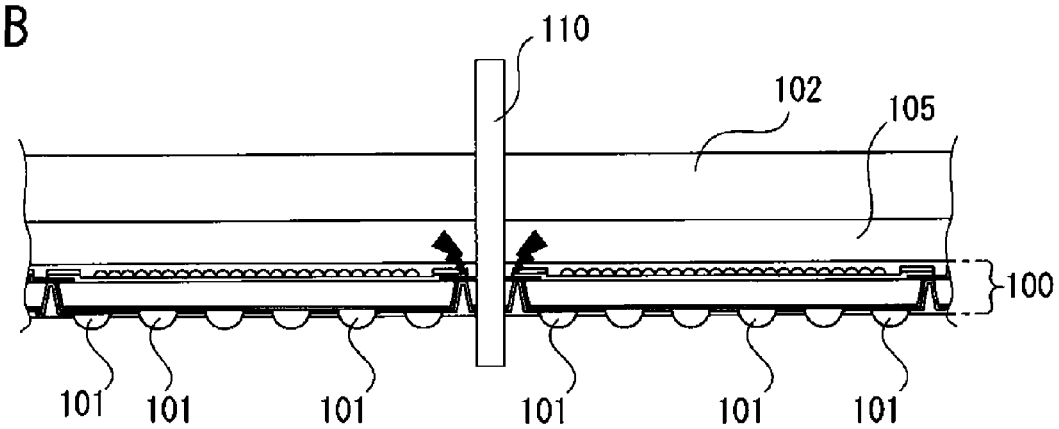

SEMICONDUCTOR DEVICE WITH A CHIP PREVENTION MEMBER

BACKGROUND

The present technology relates to a semiconductor device and a method of manufacturing the semiconductor device, and more particularly, to a technology field for providing a chip prevention member with a higher Young's modulus than a transparent resin layer in a dicing portion and preventing chipping of a semiconductor layer caused in dicing.

Japanese Unexamined Patent Application Publication No. 2008-66679 is an example of the related art.

In recent years, PKGs (packaging) of solid-state imaging elements (image sensors) have been mass-produced in a form called a chip size PKG (hereinafter referred to as a CSP). Such a CSP is different from a cavity PKG of the related art formed of ceramics or a mold resin. For example, as a cavity configuration in which a gap between adjacent chips is spaced by a resin wall on a wafer is formed, a protective layer (for example, transparent glass) and a Si (silicon) wafer of a sensor unit are bonded, a through silicon via (hereinafter referred to as a TSV) is formed, rewiring is performed on an opposite surface to an imaging surface, solder balls are provided, and finally dicing is performed for fragmentation.

FIG. 12A is a diagram illustrating an example of the configuration of a solid-state imaging element (semiconductor device) of a CSP that has the above-mentioned cavity configuration. In the CSP having the cavity configuration, as illustrated in FIG. 12A, a semiconductor layer 100 and a protective layer 102 are bonded by resin walls 103 formed as adhesives. In this case, an inner space 104 partitioned by the semiconductor layer 100, the protective layer 102, and the resin walls 103 is filled with air. As illustrated in the drawing, a plurality of solder balls 101 are formed on a rear surface side of an imaging surface of the semiconductor layer 100.

In the CSP, Deep-RIE or an insulation film ($SiO_2$) is formed through a TSV forming process. However, in order to form the film for excellent productivity, it is necessary to reduce an aspect ratio of a via diameter to the thickness of Si used to form the semiconductor layer 100. Therefore, Si is thinned to a thickness of, for example, about 50 μm to about 100 μm through a back grinding (hereinafter referred to as a BGR) process.

However, since the inner space 104 filled with air is formed in the CSP having the cavity configuration as illustrated in FIG. 12A, a portion that supports Si (semiconductor layer 100) having the above-described thickness of about 50 μm to about 100 μm is very small. Therefore, in particular, in an image sensor with a large size, there is a problem that the semiconductor layer 100 may be bent in a BGR process or may be considerably bent due to stress occurring when the CSP is mounted on a substrate after the BGR process. FIG. 12B is a diagram illustrating an image of bending (warping) of the semiconductor layer 100 in this case.

When the size of an image sensor is a small, an aspect ratio of the thickness to the width of Si is small. Therefore, mechanical rigidity of Si is relatively high and considerable warping rarely occurs. However, when an image sensor has a large size, the aspect ratio of the thickness to the width of Si is large. Therefore, as the mechanical rigidity of Si is weakened, considerable warping easily occurs.

The fact that the semiconductor layer 100 is warped means that the imaging surface is curved. Accordingly, there is a problem that optical accuracy deteriorates due to the curving of an imaging surface. Specifically, when the above-described warping occurs, an optically focused position of a lens is deviated at the center and periphery of a sensor. Therefore, when focusing is achieved at the center, there is a problem that blur occurs at the periphery.

In order to resolve the problems caused due to the CSP having the cavity configuration, a CSP having a cavity-less configuration illustrated in FIG. 13A has been suggested. In the CSP having the cavity-less configuration, as illustrated in FIG. 13A, a gap between the semiconductor layer 100 and the protective layer 102 formed of glass is filled with a transparent adhesive resin and is formed as a transparent resin layer 105. In other words, with regard to the foregoing CSP having the cavity configuration illustrated in FIG. 12A, the inner space 104 is filled not with air but with a transparent resin.

In such a cavity-less configuration, not only the mechanical rigidity of the Si (semiconductor layer 100) single body but also the rigidity of the protective layer 102 formed of relatively thick glass of, for example, about 300 μm to about 800 μm are added in the warping, as illustrated in FIG. 12B. Therefore, since the mechanical rigidity can be increased, it is possible to efficiently prevent the warping from occurring.

However, at a wafer level, the adhesive resin forming the transparent resin layer 105 is bonded to the glass (protective layer 102) on the entire wafer surface in order to realize the above-described cavity-less CSP configuration. Therefore, a film stress should be caused to be as small as possible in the transparent resin forming the transparent resin layer 105. Otherwise, the warping may occur when the Si and the glass are bonded. Here, the fact that the stress is caused to be small means that a modulus generally also decreases (softens). Accordingly, in order to realize the cavity-less configuration, as illustrated in FIG. 13A while preventing the above-described warping from occurring, it is necessary to decrease the modulus of the transparent resin forming the transparent resin layer 105 (lower the Young's modulus).

SUMMARY

However, when the modulus of the transparent resin forming the transparent resin layer 105 decreases, as described above, chipping (Si chipping) of the semiconductor layer 100 may occur at the time of dicing for fragmentation. FIG. 13B illustrates a state at the time of the dicing. As illustrated in the drawing, at the time of the dicing, a predetermined position (dicing portion) is cut by a dicing blade 110 in a layer structure before the fragmentation. At the time of the dicing, the semiconductor layer 100 is not fixed and is shaken when the modulus of the transparent resin forming the transparent resin layer 105 is small. So-called chattering occurs. Chipping (cracking) may occur on a sensor-active surface, that is, a surface of the semiconductor layer 100 coming into contact with the transparent resin layer 105. The fact that the transparent resin with the small modulus clogs the dicing blade 110 and a shearing force is thus weakened is one cause of the chipping on the sensor-active surface.

It is desirable to provide a semiconductor device and a method of manufacturing the semiconductor device capable of preventing chattering of a semiconductor layer or clogging of a dicing blade from occurring at the time of the dicing and preventing chipping of the semiconductor layer caused in dicing from occurring.

According to an embodiment of the present technology, there is provided a semiconductor device, which is a semiconductor device as a solid-state imaging element, the semiconductor device including a semiconductor layer, a protective layer including a transparent material, and a transparent resin layer that seals a gap between the semiconductor layer and the protective layer. A chip prevention member with a higher Young's modulus than the transparent resin layer is formed to come into contact with the semiconductor layer in a dicing portion of a layer structure before fragmentation, and dicing is performed in the dicing portion for the fragmentation.

Further, according to another configuration of the semiconductor device of an embodiment of the present technology, the transparent resin layer is interposed between the chip prevention member and the protective layer. Further, a width of the chip prevention member before the dicing is set to be in a range of 1.5 times to 3.0 times as large as a thickness B of a dicing blade used to cut the chip prevention member, and the width of the chip prevention member after the fragmentation is set to be in a range of (1.5B/2−B/2) to (3B/2−B/2). Further, a Young's modulus of the transparent resin layer is set to be equal to or less than 1.5 Gpa, and a Young's modulus of the chip prevention member is set to be equal to or greater than 2.5 Gpa. Further, the chip prevention member includes a resin. Further, the chip prevention member includes any of a siloxane-based resin, an acrylic-based resin, and an epoxy-based resin. Further, a resin material of the chip prevention member contains a filler. Further, the protective layer includes glass.

According to an embodiment of the present technology, as a method of manufacturing a semiconductor device, the following method is proposed. That is, according to an embodiment of the present technology, there is provided a method of manufacturing a semiconductor device, which is a method of manufacturing a semiconductor device as a solid-state imaging element, the method including forming a layer structure before fragmentation in which a gap between a semiconductor layer and a protective layer including a transparent material is sealed by a transparent resin at a wafer level so that a chip prevention member with a higher Young's modulus than a transparent resin layer is formed to come into contact with the semiconductor layer in a dicing portion for the fragmentation of the semiconductor device, and performing dicing on the layer structure before the fragmentation in the dicing portion, which is formed in the step of forming the layer structure before the fragmentation.

According to the embodiments of the present technology, the semiconductor device has a configuration in which a gap between the semiconductor layer and the protective layer is sealed by the transparent resin, as in the cavity-less configuration of the related art. That is, in this respect, it is possible to prevent the warping of the semiconductor layer caused in the back grinding (BGR) process from occurring. Further, according to the embodiments of the present technology, the chip prevention member with a higher Young's modulus (higher modulus) than the transparent resin layer is formed to come into contact with the semiconductor layer in the dicing portion in the layer structure before the fragmentation. Thus, by forming the chip prevention member with the high Young's modulus to come into contact with the semiconductor layer, it is possible to prevent the chattering (shaking) of the semiconductor layer at the time of the dicing and to prevent the clogging of the dicing blade, compared to the cavity-less configuration of the related art in which the transparent resin layer with a relatively low Young's modulus comes into contact with the semiconductor layer. As a result, it is possible to efficiently prevent the chipping of the semiconductor layer caused in the dicing from occurring.

According to the above-described embodiments of the present technology, in the semiconductor device serving as a solid-state imaging element designed to prevent warping of the semiconductor layer caused in the BGR process from occurring by sealing the gap between the protective layer and the semiconductor layer with the transparent resin layer, it is possible to prevent the chattering of the semiconductor layer from occurring and prevent the clogging of the dicing blade at the time of the dicing, and thus efficiently prevent the chipping of the semiconductor layer caused in the dicing.

BRIEF DESCRIPTION OF THE DRAWINGS

FIGS. 6A and 6B are diagrams illustrating a state of cutting of the second step in the layer structure before the fragmentation according to the embodiment;

FIGS. 13A and 13B are diagrams illustrating an example of the configuration and a problem of a solid-state imaging element (semiconductor device) having a cavity-less configuration according to the related art.

DETAILED DESCRIPTION OF THE EMBODIMENTS

Figure 1:
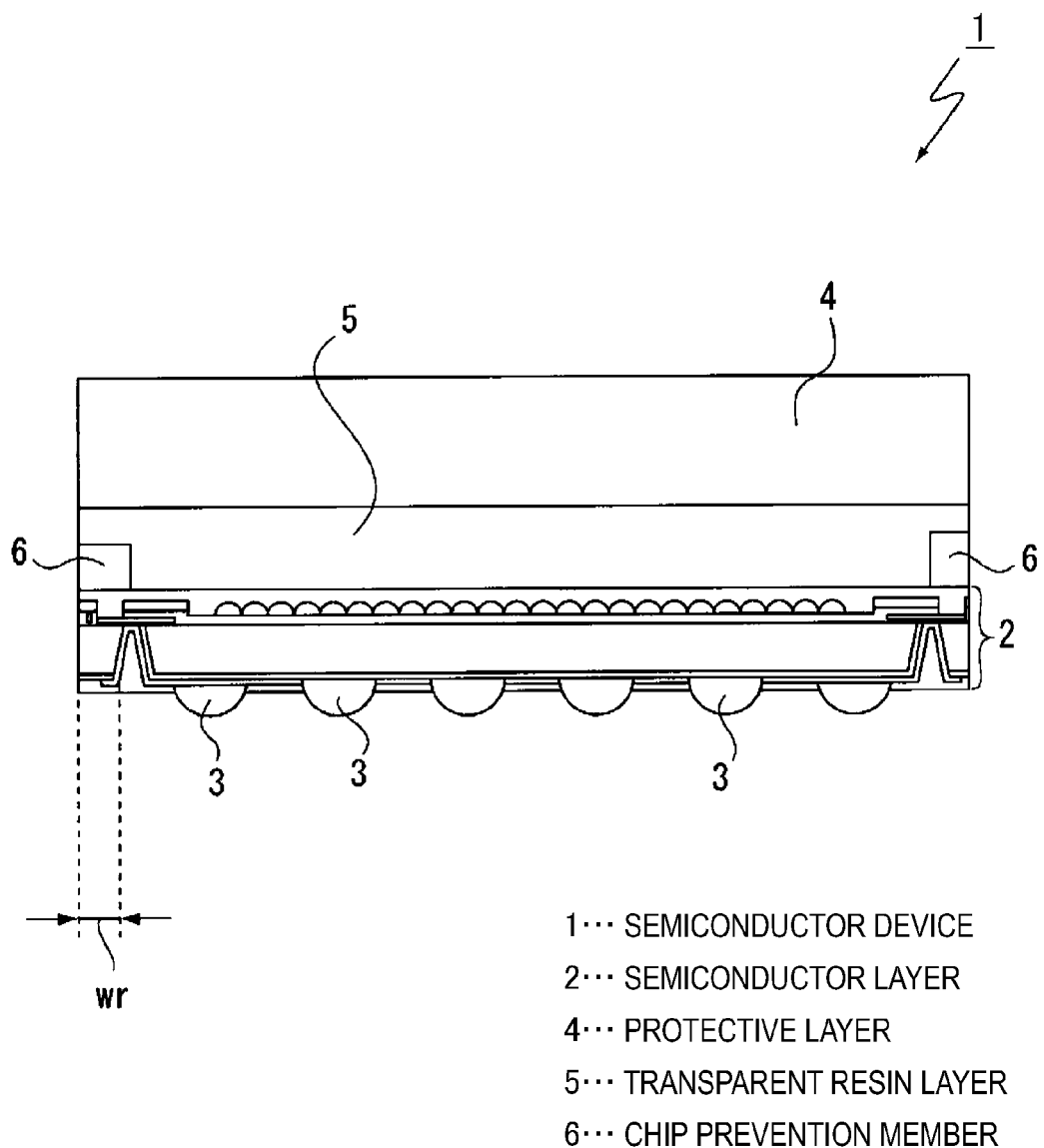
FIG. 1 is a diagram illustrating the cross-sectional configuration of a semiconductor device according to an embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, embodiments related to the present technology will be described.

The description will be made in the following order.

<1. Semiconductor device according to embodiment>

<2. Method of manufacturing semiconductor device according to embodiment>

<3. Example of configuration of imaging optical unit using solid-state imaging element according to embodiment>

<4. Modification examples>

<1. Semiconductor Device According To Embodiment>

FIG. 1 is a diagram illustrating the cross-sectional configuration of a semiconductor device 1 according to an embodiment of the present technology. First, the semiconductor device 1 according to this embodiment is assumed to be a semiconductor device serving as a solid-state imaging element. In the drawing, a semiconductor layer 2 functions as, for example, a sensor unit of the solid-state imaging element. Although not illustrated in detail, for example, a plurality of light-receiving elements or micro-color filters for R, G, and B are formed on the surface (imaging surface) side of the semiconductor layer 2.

A protective layer 4 is formed on the surface side (front surface side) of the semiconductor layer 2. The protective layer 4 is formed to protect the imaging surface of the semiconductor layer 2 and a material with relatively high rigidity is used. In this example, transparent glass is used for the protective layer 4.

The semiconductor device 1 according to this embodiment has, as the entire configuration, a configuration in which the semiconductor layer 2 and the protective layer 4 are bonded by a transparent resin (transparent adhesive resin) with a relatively small Young's modulus, as in the cavity-less configuration described above in FIGS. 13A and 13B. The layer formed of the transparent resin configured for the bonding is referred to as a transparent resin layer 5. The purpose for causing the transparent resin layer 5 to have the low Young's modulus (causing the modulus to be small) is the same as that of the case of the cavity-less configuration according to the related art.

The semiconductor devices 1 according to this embodiment are mass-produced in the above-described form of the chip size PKG (hereinafter referred to as a CSP) which is different from the cavity PKG of the related art formed of ceramics or a mold resin. The semiconductor devices 1 are formed in such a manner that the protective layer 4 and a Si wafer (semiconductor layer 2) of the sensor unit are bonded, a through silicon via (hereinafter referred to as a TSV) is formed in the semiconductor layer 2, rewiring is performed on an opposite surface to the imaging surface, a plurality of solder balls 3 as illustrated in the drawing are provided, and finally dicing is performed for fragmentation.

In the semiconductor device according to this embodiment, inside an outermost circumference region on the inner side of the side wall surface of the semiconductor device formed by the dicing for the fragmentation, a chip prevention member 6 formed of a material having a higher Young's modulus (larger modulus) than that of the transparent resin layer 5 is formed to come into contact with the semiconductor layer 2, as illustrated in the drawing. As will be understood from the following description, the chip prevention member 6 illustrated in the drawing becomes a fragment in a dicing portion in which the dicing is performed at a wafer level before the fragmentation. In other words, the semiconductor device 1 of this case is fragmented by forming the chip prevention member 6 with a width sufficiently larger than the thickness of a dicing blade in advance at the wafer level and performing the dicing on a portion in which the chip prevention member 6 is formed.

As understood from the foregoing description, the semiconductor device 1 illustrated in FIG. 1 according to this embodiment has a cavity configuration in the portion in which the dicing is performed and has the entire configuration in which the bonding is performed by the transparent resin as a cavity-less configuration. That is, from this viewpoint, the configuration of the semiconductor device 1 can be said to be a hybrid configuration (hybrid cavity-less configuration) of the cavity configuration and the cavity-less configuration.

Figure 2:
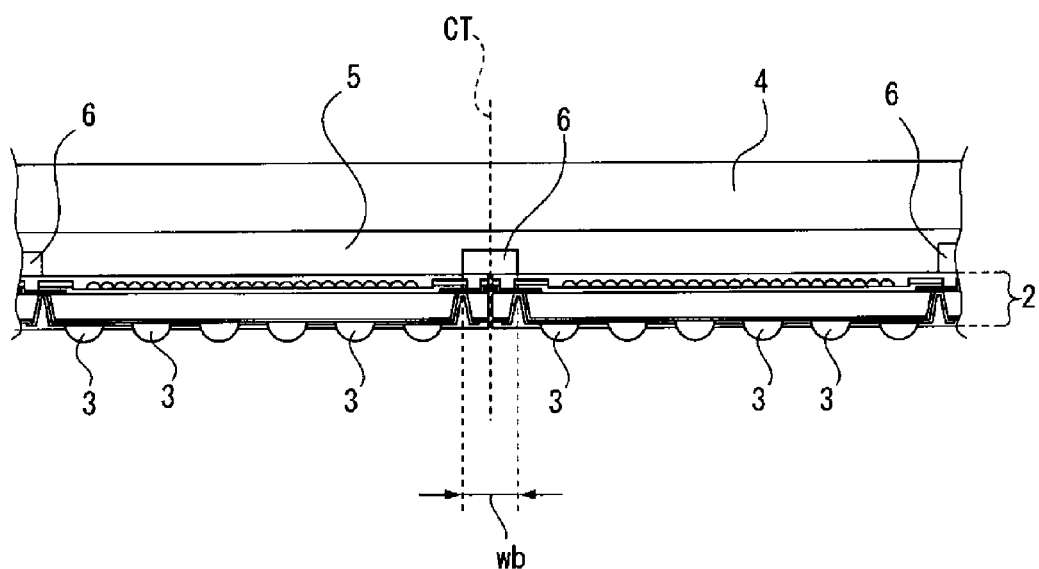
FIG. 2 is a diagram illustrating the cross-sectional configuration of a layer structure before fragmentation in a previous step of fragmenting the semiconductor device.
Figure 3:
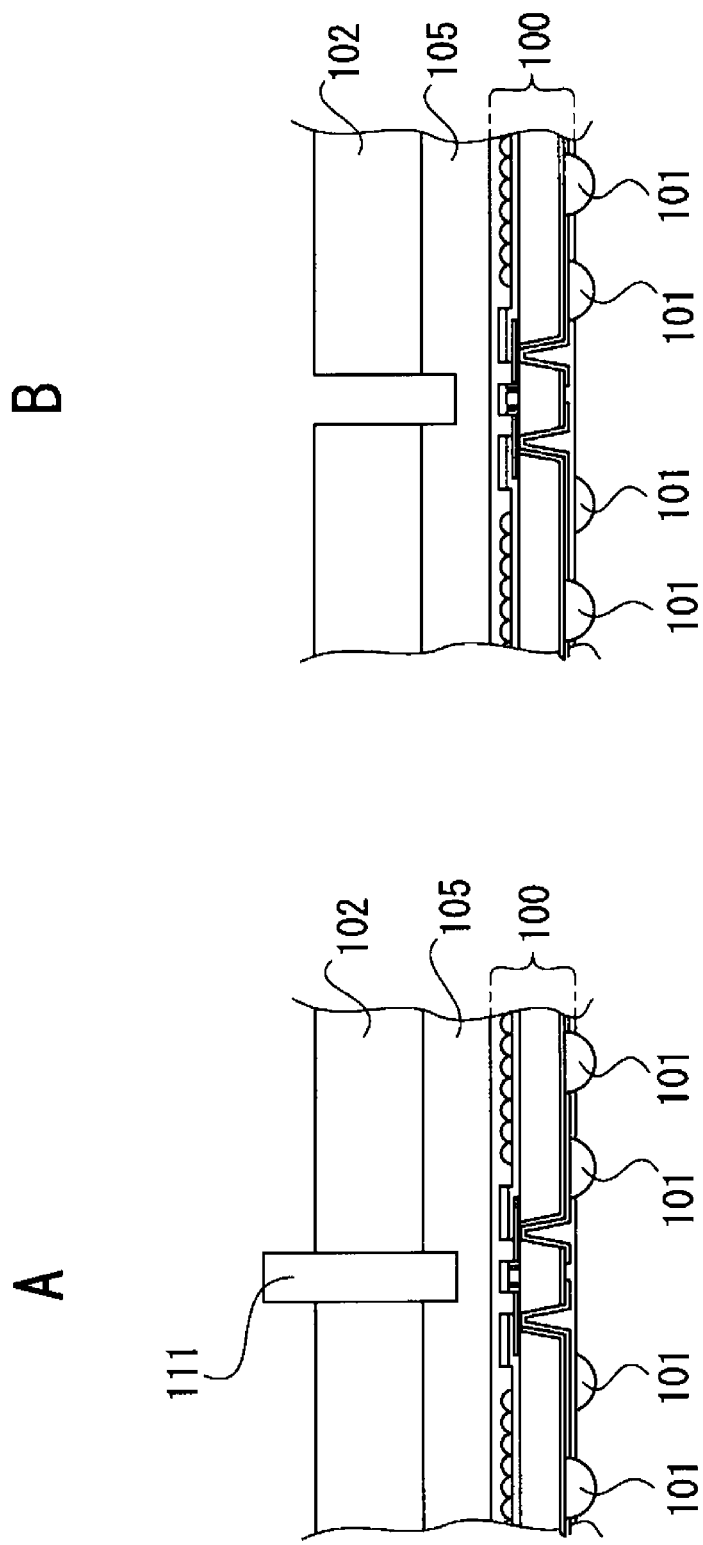
FIGS. 3A and 3B are diagrams illustrating a state of cutting of the first step in a cavity-less configuration of the related art.
Figure 4:
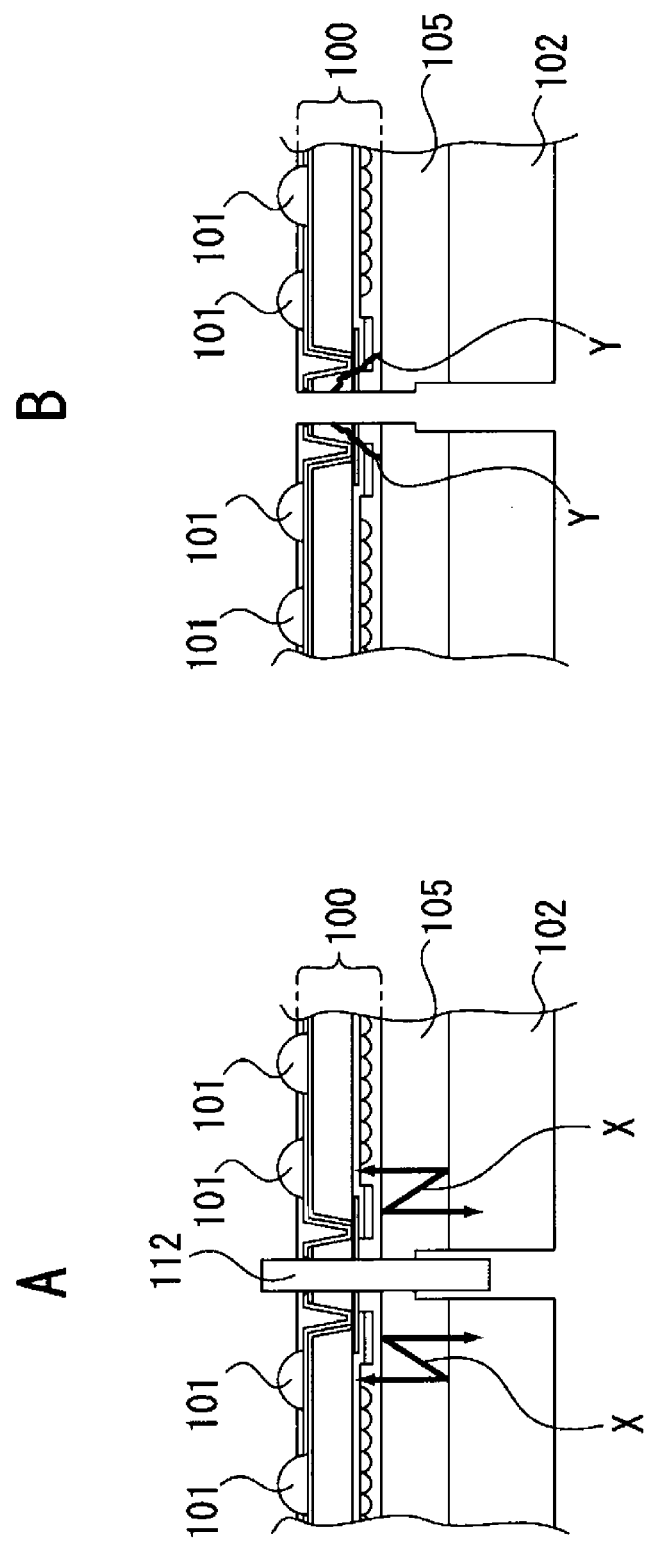
FIGS. 4A and 4B are diagrams illustrating a state of cutting of the second step in the cavity-less configuration of the related art.

FIG. 2 illustrates the cross-sectional configuration of a layer structure before the fragmentation which is a collective of the plurality of semiconductor devices 1 in a previous step of fragmenting the semiconductor device 1. As described above, in the layer structure before the fragmentation, the chip prevention member 6 coming into contact with the semiconductor layer 2 is formed in a dicing portion (indicated by CT in the drawing) in which the dicing is performed for the fragmentation.

Figure 12:
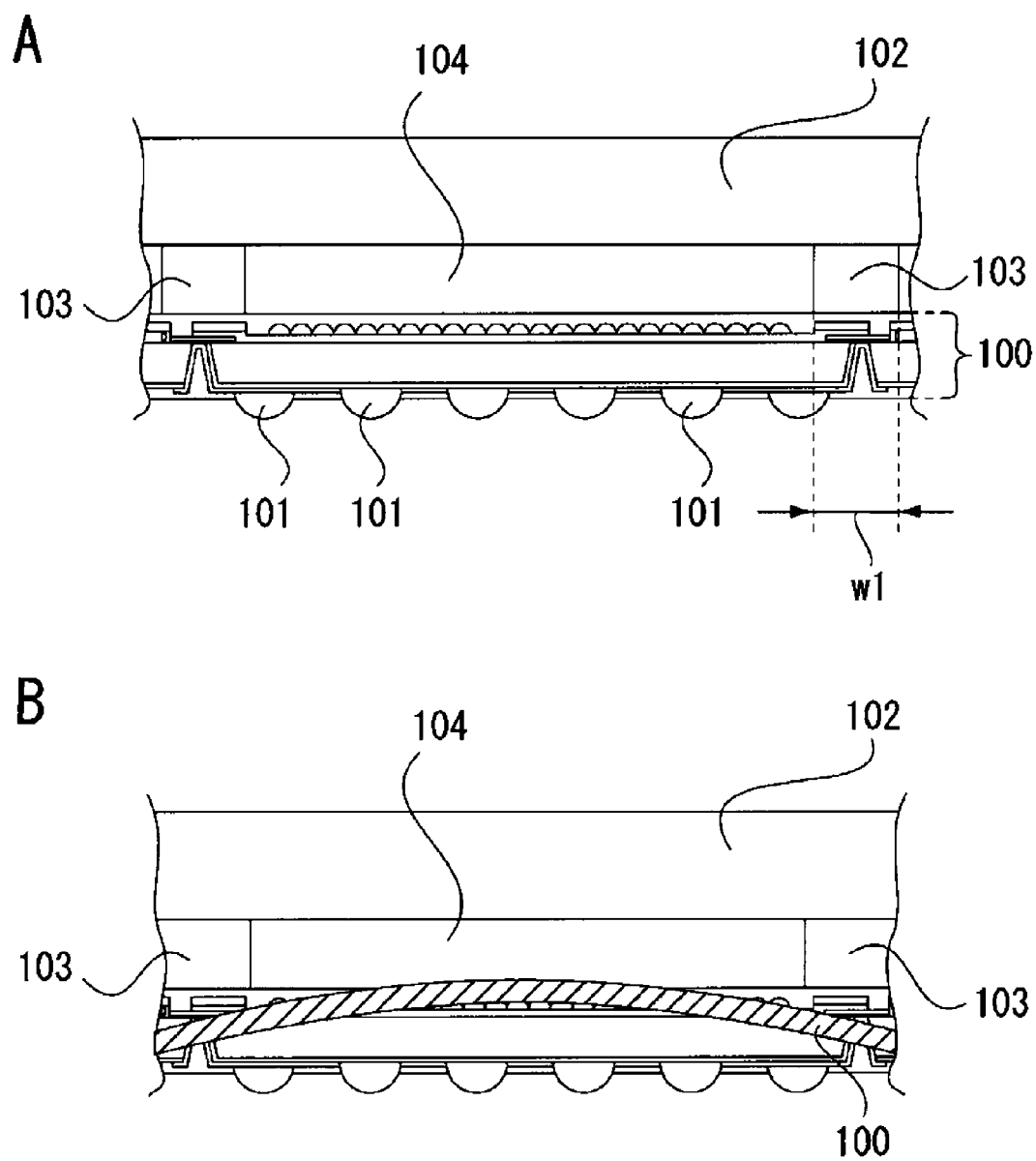
FIGS. 12A and 12B are diagrams illustrating an example of the configuration and a problem of a solid-state imaging element (semiconductor device) having a cavity configuration according to the related art.

As illustrated in FIG. 2, a width Wb of the chip prevention member 6 on the layer structure before the fragmentation, that is, the width wb of the chip prevention member 6 before the dicing, can be set to be less than a width w1 of the resin wall 103 of the cavity configuration illustrated above in FIG. 12. In the cavity configuration of FIG. 12, an adhesive strength by which Si (semiconductor layer 100) and the glass (protective layer 102) are adhered by the resin wall 103 of the cavity has to be ensured. Therefore, the width w1 has to be ensured to some extent (for example, at least 0.3 mm or more). However, in the configuration of FIG. 2, it is not necessary to enlarge the width wb of the chip prevention member 6 to ensure the adhesive force for a configuration in which the semiconductor layer 2 and the protective layer 4 are entirely adhered by the transparent resin layer 5 on the cavity-less side. Accordingly, the width wb may be set to a thickness of the dicing blade +α. At least about 0.1 mm suffices as the width wb.

Thus, when the width wb can be set to be small, a stress is low. Further, since the bonding with the protective layer 4 is not performed, the chip prevention member 6 may not have the adhesive force. Since the bonding is performed with the transparent resin with higher flexibility, the chip prevention member 6 may not have flexibility to absorb a variation in the height, the warping, and flatness of the material. From this viewpoint, the modulus of the chip prevention member 6 can be set to be high.

In this example, for example, a resin is used as the chip prevention member 6.

When the modulus of the transparent resin layer 5 is high, chipping at the time of the dicing can be suppressed without providing the chip prevention member 6. However, the modulus of the transparent resin layer 5 has to be set to be low due to the problem of the above-described warping. In this embodiment, the chipping at the time of the dicing is designed to be suppressed by providing a resin capable of increasing the modulus in correspondence with the dicing portion.

As will be described below, the above-described dicing for the fragmentation is performed in two separate processes, that is, a process of performing cutting on the front surface side and a process of performing cutting from the rear surface side. A state of cutting of the two steps in the cavity-less configuration of the related art and the reason why the chipping occurs due to cutting will be described with reference to FIGS. 3A to 4B.

In this case, as illustrated in FIG. 3A, first, the cutting is performed by inserting a dicing blade 111 for glass cutting from the front surface side (in the case of the drawing, the side of the protective layer 102) of the layer structure before the fragmentation. As illustrated in FIG. 3B, the cutting (cutting of the first step) from the front surface side ends when the dicing blade 111 reaches the transparent resin layer 105.

Subsequently, a dicing blade 112 for Si (silicon) cutting is inserted from the rear surface side of the layer structure before the fragmentation in which the cutting of the first step ends, as illustrated in FIG. 4A, and the remaining portions of the semiconductor layer 100 and the transparent resin layer 105 are cut, as illustrated in FIG. 4B. By performing the cutting in the plurality of predetermined portions (dicing portions) of the layer structure before the fragmentation, the fragmentation of the semiconductor devices is performed.

In this case, the above-described chipping on the sensor active surface occurs at the time of the cutting from the rear surface side, as illustrated in FIGS. 4A and 4B. Specifically, at the time of the cutting from the rear surface side, only the transparent resin with the small modulus is present near the dicing portion in the cavity-less configuration of the related art. Therefore, when the dicing blade 112 is rotated, the semiconductor layer 100 may not be fixed and thus may chatter (be shaken) (X in the drawing). Thus, the chipping (Y in the drawing) may occur on the sensor active surface (which is a surface coming into contact with the transparent resin layer 105 in the semiconductor layer 100). In the cavity-less configuration of the related art, the transparent resin with the small modulus may easily clog the dicing blade 112 at the time of the cutting from the rear surface side, and the shearing force of the dicing blade 112 may thus be weakened due to the clogging. This point is also one cause of the chipping on the sensor active surface occurring.

Figure 5:
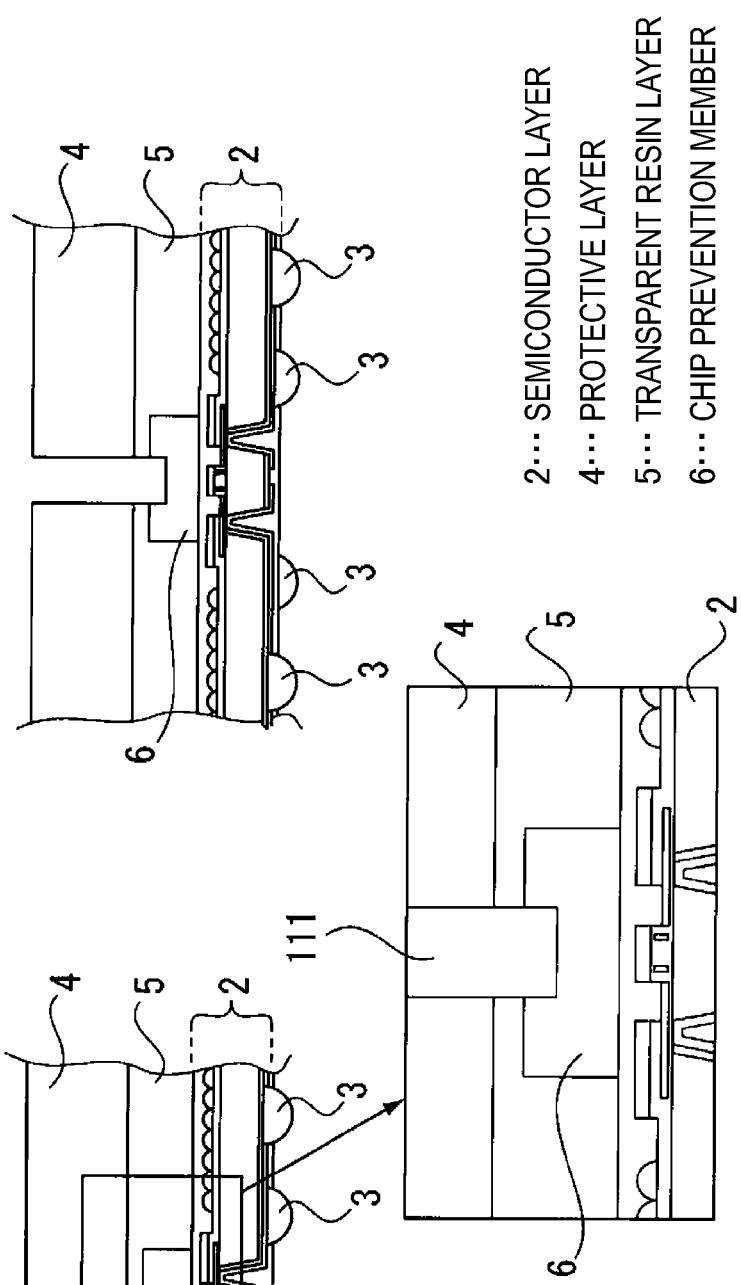
FIGS. 5A and 5B are diagrams illustrating a state of cutting of the first step in the layer structure before the fragmentation according to the embodiment.

FIGS. 5A to 6B exemplify a case in which the cutting of the two steps is performed in the same manner on the layer structure before the fragmentation according to this embodiment. In the case of the embodiment, first, the cutting from the front surface side is likewise performed as the first step by inserting the dicing blade 111 for glass cutting from the front surface side of the protective layer 4 (FIG. 5A). At this time, as illustrated in the enlarged diagram of FIG. 5A, the cutting of the first step ends when the dicing blade 111 reaches the chip prevention member 6. FIG. 5B illustrates the state of the layer structure before the fragmentation when the cutting of the first step ends. A part of the chip prevention member 6 is in the cut state when the cutting of the first step ends, as in the drawing.

The cutting from the rear surface side in the second step is performed, as illustrated in FIG. 6A, by inserting the dicing blade 112 for Si cutting from the rear surface side of the semiconductor layer 2. As illustrated in FIG. 6B, the remaining portions of the semiconductor layer 2 and the chip prevention member 6 are cut by this cutting.

In this embodiment, the chip prevention member 6 with the high Young's modulus comes into contact with the semiconductor layer 2 near the dicing portion at the time of the cutting illustrated in FIGS. 6A and 6B. Therefore, in this case, even when the dicing blade 112 is rotated, the semiconductor layer 2 can be fixed. Thus, it is possible to efficiently prevent the chattering of the semiconductor layer 2 from occurring, as described above. In the configuration of this embodiment, the transparent resin with the small modulus does not come into contact with the dicing blade 112 when the semiconductor layer 2 is cut by the dicing blade 112. Moreover, it is possible to prevent the above-described clogging of the dicing blade 112 from occurring. From this viewpoint, in this embodiment, it is possible to efficiently prevent the chipping on the sensor active surface caused in the dicing.

Such a chipping prevention effect can be likewise obtained, for example, even when the fragmentation is performed through only dicing from the front surface side or the rear surface side.

In this example, as illustrated also above in FIGS. 1 and 2, the chip prevention member 6 is formed so as not to come into contact with the relatively hard protective layer 4. In other words, the transparent resin layer 5 is configured to be interposed between the chip prevention member 6 and the protective layer 4.

When the chip prevention member 6 comes into contact with the protective layer 4, there is little reason for bonding the semiconductor layer 2 and the protective layer 4 using the transparent resin with the small modulus. Therefore, the prevention effect of the warping caused in the bonding may not be obtained. Accordingly, by not bringing the chip prevention member 6 into contact with the protective layer 4, it is possible to improve the prevention effect of the warping caused due to the bonding.

Figure 7:
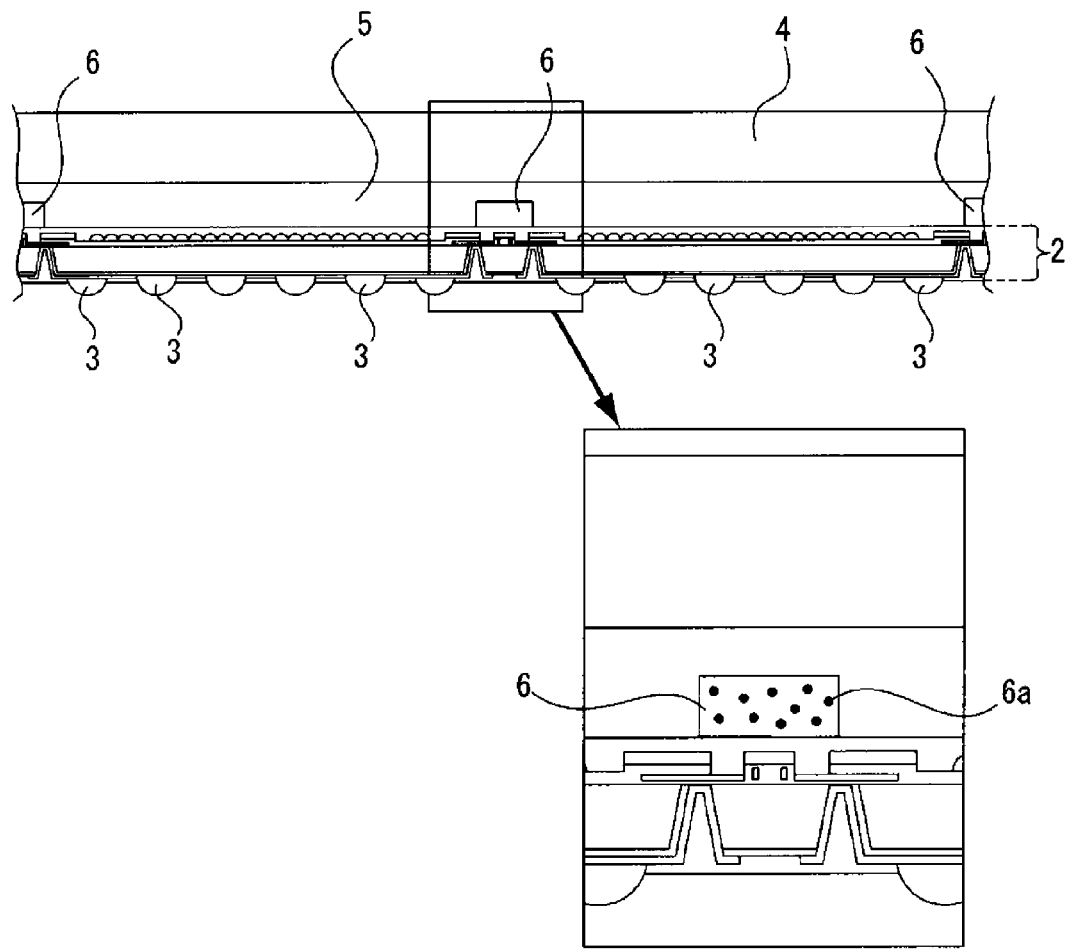
FIG. 7 is a diagram illustrating a chip prevention member in which fillers are contained.

From the viewpoint of the chipping prevention, the modulus of the chip prevention member 6 is preferably large. In this example, a resin is used as the chip prevention member 6. In this case, however, the modulus can be increased by containing fillers 6a to further harden the resin, as illustrated in FIG. 7.

As the modulus of the chip prevention member 6 is increased (the Young's modulus is increased), it is possible to strongly prevent the chattering of the semiconductor layer 2 caused in the rotation of the dicing blade 112 or the clogging of the dicing blade 112 from occurring, as described above. Thus, it is possible to improve a dicing property and strongly prevent the chipping from occurring.

Figure 8:
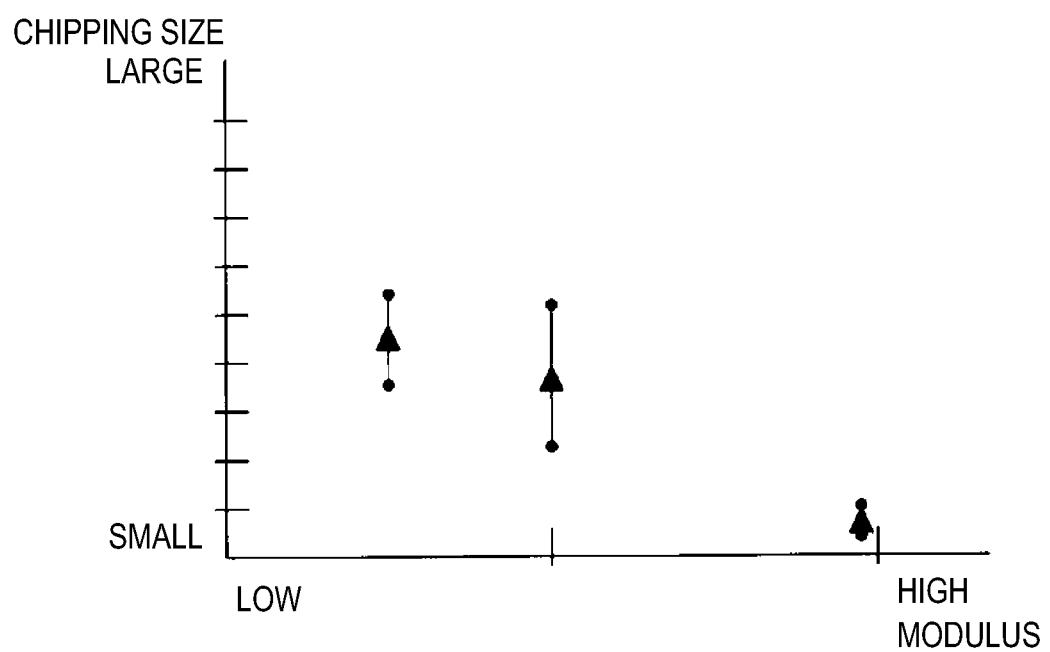
FIG. 8 is a diagram illustrating a graphed result of an experiment on a relation between the modulus of the chip prevention member and a chipping size.

FIG. 8 is a diagram illustrating a graphed result of an experiment on a relation between the modulus of the chip prevention member 6 and a chipping size. In the experiment, each chipping size is measured by performing the dicing a plurality of times using three kinds of chip prevention members 6 with different moduli. In the drawing, the measurement result of the chipping size of each of the three kinds of chip prevention members 6 is indicated by two ● marks and one ▲ mark. The two ● marks indicate the maximum value and the minimum value of each chipping size and the ▲ mark indicates the average value of the chipping size.

From the experiment result illustrated in FIG. 8, it can be understood that the chipping can be further prevented from occurring by increasing the modulus of the chip prevention member 6.

The moduli (Young's moduli) of the transparent resin layer 5 and the chip prevention member 6 are preferably set at least as follows. That is, the modulus of the transparent resin layer 5 is equal to 1.5 Gpa (Giga Pascal) and the modulus of the chip prevention member 6 is equal to or greater than 2.5 Gpa.

Hereinafter, examples of the materials of the transparent resin layer 5 and the chip prevention member 6 will be given. For example, a siloxane-based adhesive or an acrylic-based adhesive can be used as the material of the transparent resin layer 5. An epoxy-based adhesive, an ester-based adhesive, or a polyimide-based adhesive can also be used. When such materials are used, the Young's moduli are as follows.

Siloxane-based adhesive: 0.1 Gpa to 0.8 Gpa
Acrylic-based adhesive: 0.1 Gpa to 0.5 Gpa
Epoxy-based adhesive: 1.8 Gpa to 2.5 Gpa
Ester-based adhesive: 0.1 Gpa to 0.5 Gpa
Polyimide-based adhesive: 0.1 Gpa to 0.5 Gpa In regard to the chip prevention member 6 formed of the resin, for example, a photosensitive siloxane-based adhesive, a photosensitive acrylic-based adhesive, or a photosensitive epoxy-based adhesive can be used. The Young's moduli obtained by these materials are as follows.

Photosensitive siloxane-based adhesive: 0.3 Gpa to 0.7 Gpa
Photosensitive acrylic-based adhesive: 2.0 Gpa to 3.5 Gpa
Photosensitive epoxy-based adhesive: 1.8 Gpa to 3.0 Gpa When a siloxane-based resin is used, the modulus is preferably increased by containing the fillers 6a. A hybrid resin of an acrylic-based adhesive plus an epoxy-based adhesive may be used for the chip prevention member 6 formed of the resin.

The actual material is preferably selected also in consideration of a heat resistance property and a chemical resistance property.

Incidentally, as described above, the width (wb) of the chip prevention member 6 may be set to be larger at least than the thickness of the dicing blade 112 that cuts the chip prevention member 6. However, when a difference between the width wb of the chip prevention member 6 and the thickness of the dicing blade 112 is too small, degradation of a dicing property may be caused. For example, a damping property of the semiconductor layer 2 may be reduced at the time of the dicing or a probability that the clogging of the blade occurs may increase. Accordingly, the width wb of the chip prevention member 6 is preferably set to be in the range of about 1.5 times to about 3.0 times the thickness of the dicing blade 112.

When the width wb of the chip prevention member 6 is set to be 1.5 times to 3.0 times the thickness of the dicing blade 112, as described above, the width wr of the chip prevention member 6 in the semiconductor device 1 after the fragmentation performed by the dicing, as illustrated in FIG. 1, is in the range of $(1.5B/2-B/2)$ to $(3B/2-B/2)$ in consideration of the cutting, as in FIG. 6B. Here, "B" indicates the thickness of the dicing blade 112.

<2. Method of Manufacturing Semiconductor Device According To Embodiment>

Figure 9:
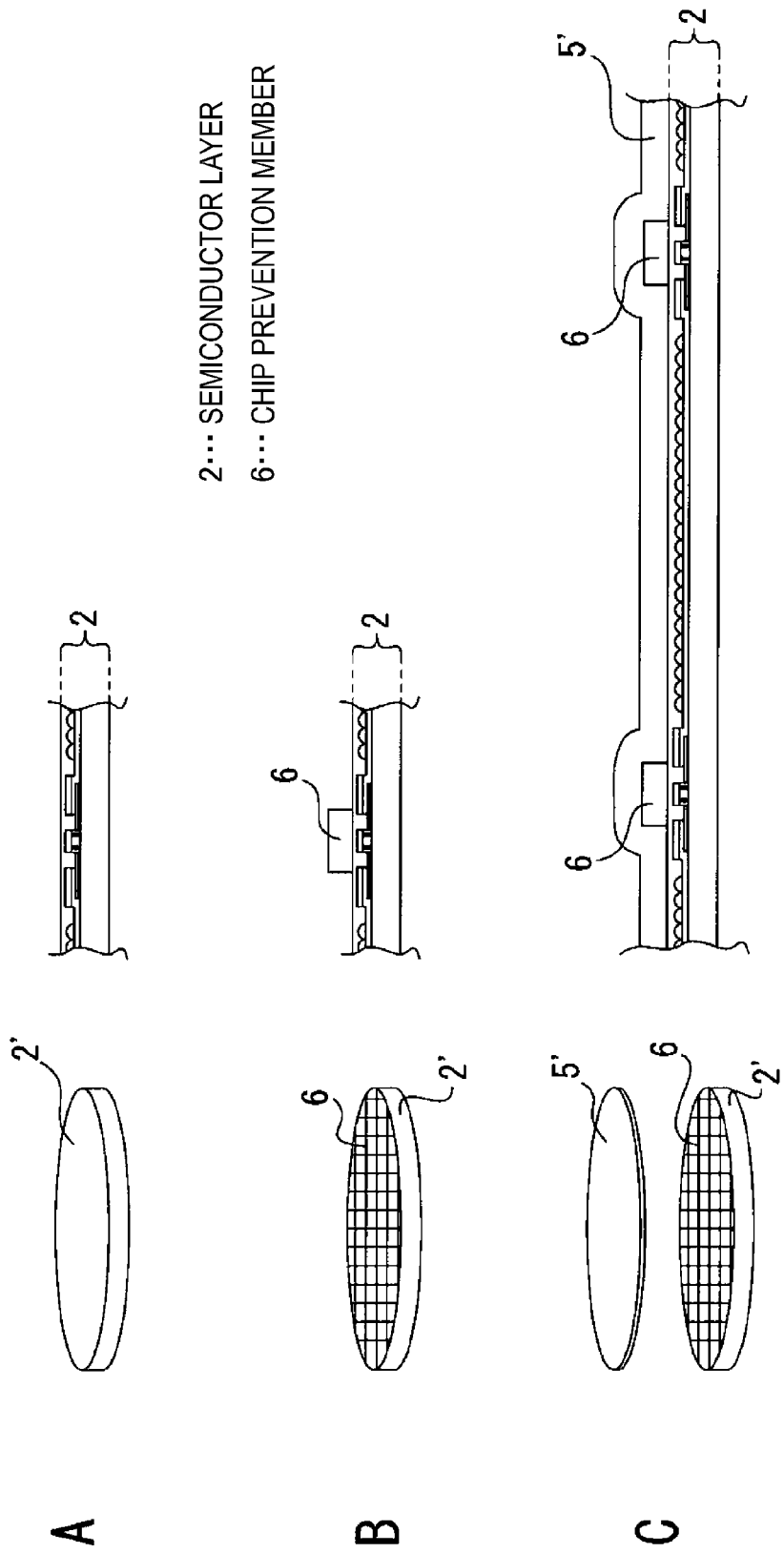
FIGS. 9A to 9C are diagrams illustrating a method of manufacturing the semiconductor device according to the embodiment.

Next, a method of manufacturing the semiconductor device 1 described above according to the embodiment will be described with reference to FIGS. 9A to 10. Of FIGS. 9A to 9C, FIG. 9A is a perspective view and a sectional view illustrating a silicon wafer T as a collective of the plurality of semiconductor layers 2. In the manufacturing method according to the embodiment, the chip prevention members 6 are formed on such a silicon wafer 2', as illustrated in FIG. 9B. As understood from the foregoing description, the chip prevention members 6 are formed in the dicing portions for the fragmentation on the silicon wafer 2'. Therefore, a lattice shape is formed, as illustrated in the drawing. In this example, since a photosensitive resin adhesive is used as the material of the chip prevention members 6, a process of forming the chip prevention members 6 illustrated in FIG. 9B is performed by patterning the photosensitive resin adhesive by exposure and development.

After the chip prevention members 6 are formed, as illustrated in FIG. 9C, a transparent resin 5' which is a material used to form the transparent resin layer 5 is vacuum-laminated on the silicon wafer 2', in which the chip prevention members 6 are formed, at a high temperature equal to or less than a cross-linking temperature of the transparent resin 5'. By laminating such a transparent resin 5' in the vacuum state, as illustrated in the sectional view of FIG. 9C, the transparent resin 5' can be temporarily adhered in a conformal manner to the surface shape of the silicon wafer 2' in which the chip prevention members 6 are formed.

Figure 10:
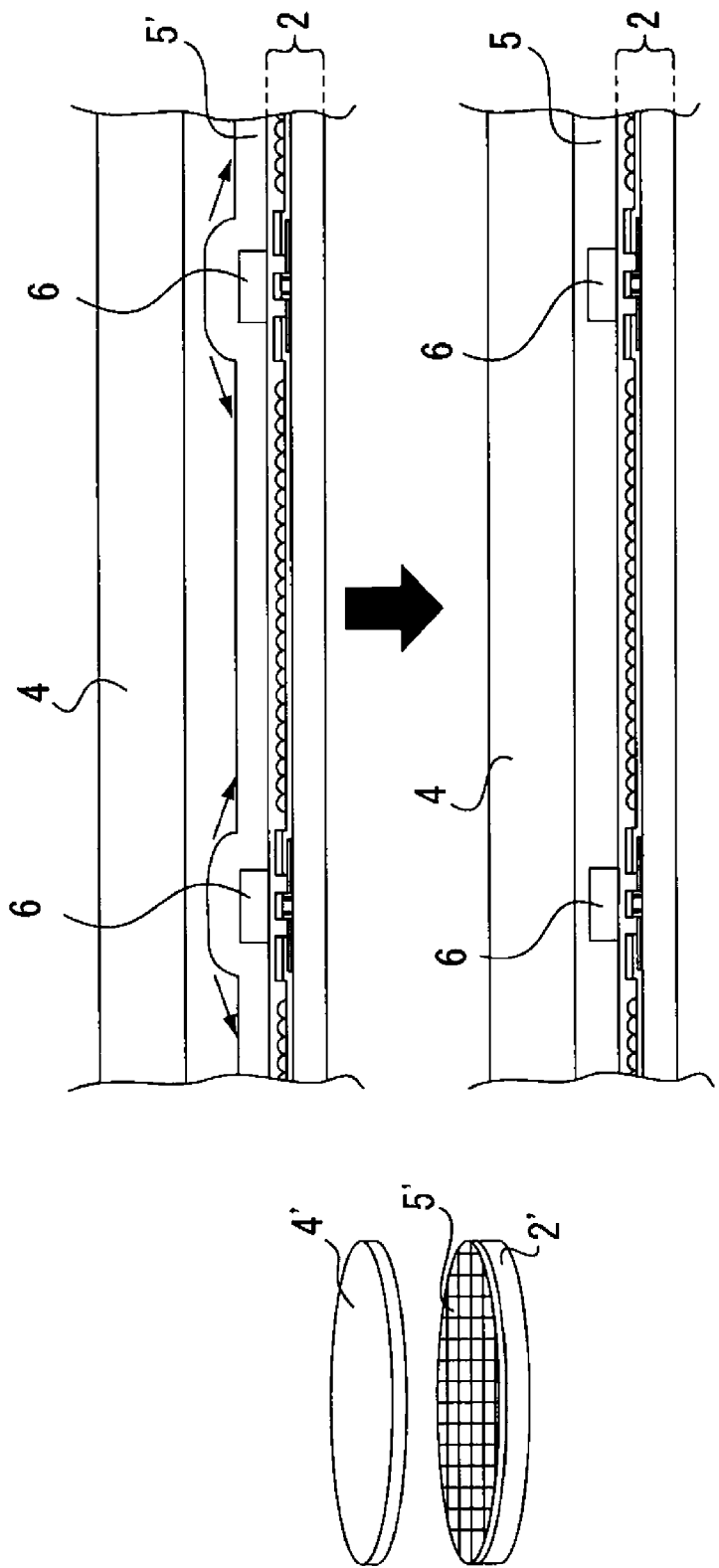
FIG. 10 is a diagram illustrating the method of manufacturing the semiconductor device according to the embodiment, as in FIGS. 9A to 9C.

After the transparent resin 5' is laminated, as illustrated in FIG. 10, a glass material 4', which is a material of the protective layer 4, is pressurized to be bonded in the vacuum state on the silicon wafer 2' on which the transparent resin 5' is laminated while being heated. Thus, step difference portions formed in the transparent resin 5' in the lamination process of FIG. 9C according to positions at which the chip prevention members 6 are formed are planarized by pressurizing the glass material 4' under the vacuum state. At this time, the transparent resin 5' flows to high portions or low portions by the above-described pressurization, and thus the glass material 4' can be bonded finally without mixture of voids (bubbles). The heating temperature in the bonding process is preferably as high as possible within the range in which the cross-linking of the transparent resin 5' serving as the resin adhesive does not progress too much. This is because the mixture of the voids can be prevented more strongly due to the fact the transparent resin 5' is melted and thus easily moves. A structure as the layer structure before the fragmentation in which the chip prevention member 6 coming into contact with the semiconductor layer 2 is formed in the dicing portion can be obtained by at least completing the bonding process illustrated in FIG. 10 and sealing the gap between the semiconductor layer 2 and the protective layer 4 with the transparent resin 5' at the wafer level.

Although the description with reference to a drawing is omitted, the cross-linking of the transparent resin 5' is performed by a heating process after the bonding process illustrated in FIG. 10. A photosensitive resin adhesive can also be used as the transparent resin 5'. In this case, the cross-linking is performed by exposure.

After the cross-linking of the transparent resin 5', the rear surface side of the semiconductor layer 2 is thinned by a back grinding (BGR) process, a TSV is processed, and rewiring is performed on the rear surface. Thereafter, as the final process, the semiconductor device 1 is fragmented by performing the dicing on the layer structure before the fragmentation subjected to the above-described processes by the dicing portion.

As understood from the above-described manufacturing process, the hybrid cavity-less configuration according to this embodiment can be realized with relative ease and with less addition of processes. Therefore, a sensor CSP with a relatively large size can be realized at a low cost without an increase in the cost.

<3. Example of Configuration of Imaging Optical Unit Using Solid-state Imaging Element According To Embodiment>

Figure 11:
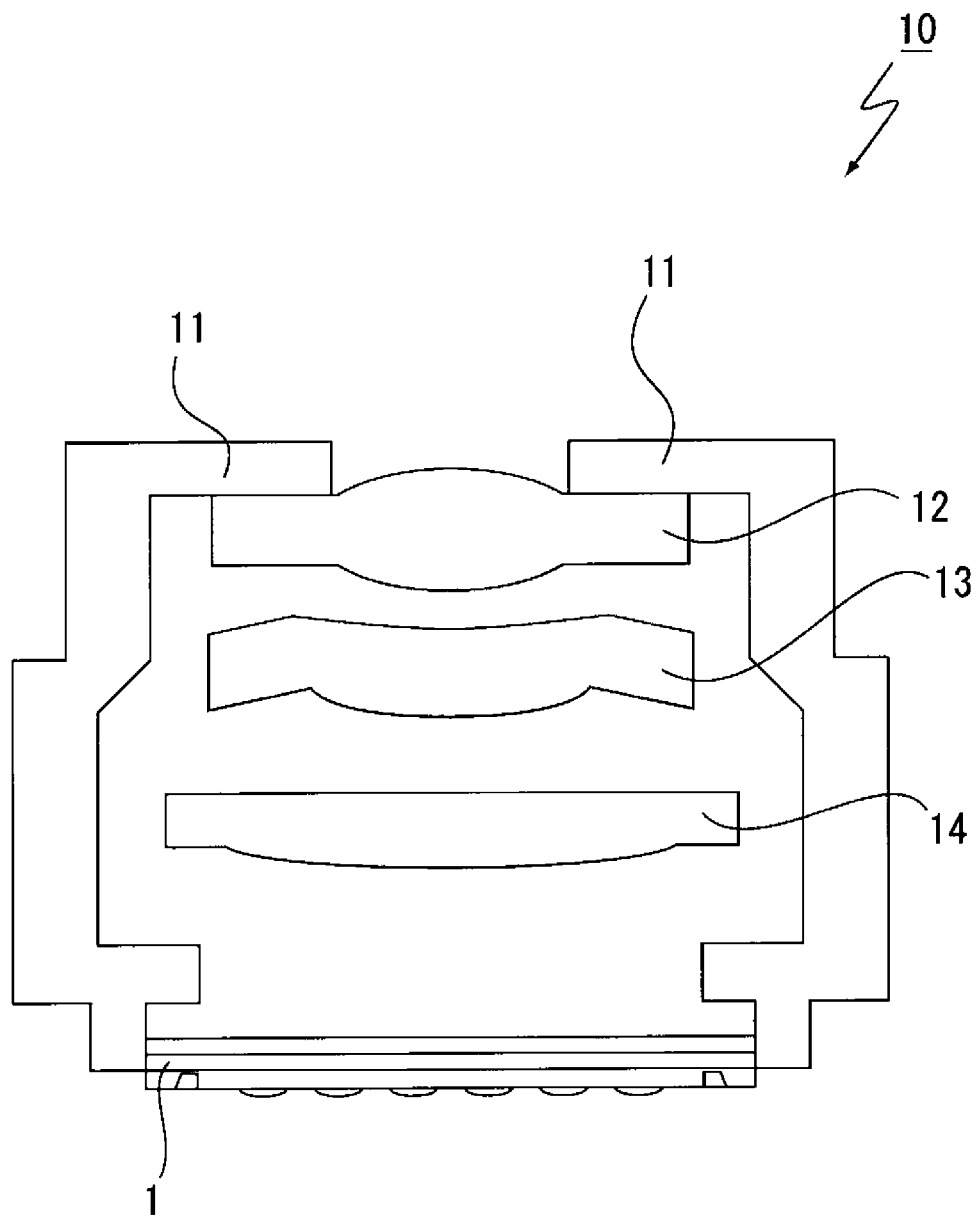
FIG. 11 is a sectional view illustrating an example of the configuration of an imaging optical unit using the semiconductor device according to the embodiment.

FIG. 11 is a sectional view illustrating an example of the configuration of an imaging optical unit 10 using the semiconductor device 1 (solid-state imaging element) according to this embodiment. As illustrated in the drawing, the imaging optical unit 10 of this case is installed in a lens barrel (lens tube) 11 so that a plurality of lenses are accommodated. Specifically, in the imaging optical unit 10 of this case, a lens 12 is installed such that a part of the lens 12 protrudes with respect to an opening portion formed in the lens barrel 11 on an object side. Lenses 13 and 14 are installed to be closer to an imaging surface side than the lens 12. A solid-state imaging element serving as the semiconductor device 1 according to this embodiment is disposed to occupy the opening portion formed on the imaging surface side of the lens barrel 11.

The solid-state imaging element serving as the semiconductor device 1 is small in size as a CSP and accordingly contributes to miniaturization of the imaging optical unit 10.

<4. Modification Examples>

The embodiment of the present technology has been described, but embodiments of the present technology are not limited to the above-described specific example. Various modification examples can be considered. For example, in the foregoing description, the chip prevention member 6 has been formed of a resin. However, for example, an inorganic material such as $SiO_2$ or SiN can also be used. In this case, the process of forming the chip prevention member 6 is performed by forming and patterning an inorganic material.

In the foregoing description, the protective layer 4 has been formed of glass. Instead of glass, the protective layer 4 may be formed of another transparent material such as a transparent resin. For example, the protective layer 4 may be formed of a Si-based material in consideration of the following situation. In the cavity configuration illustrated in FIG. 12, a necessary condensing power is configured to be obtained by a difference between a refractive index the "refractive index=about 1.6" of an on-chip lens (OCL) and a "refractive index=1" of the air in the inner space 104. In the embodiment of the present technology, since a gap between the protective layer 4 and a sensor is buried with the transparent resin layer 5 (for example, a refractive index=about 1.5), the condensing power of the lens may be weakened. Therefore, there is a concern that the sensitivity of the sensor may decrease. Accordingly, in consideration of this point, the protective layer 4 serving as the OCL is formed of a material such as SiN with a high refractive index (refractive index=about 1.7 to about 2.1).

In the foregoing description, for example, the layer structure before the fragmentation in which the chip prevention member 6 is formed to come into contact with the semiconductor layer 2 in the dicing portion has been formed by forming the chip prevention member 6 on the side of the semiconductor layer 2 and then bonding the protective layer 4 by the transparent resin 5' in a task of the wafer level (FIGS. 9A to 10). However, the layer structure before the fragmentation in which the chip prevention member 6 is formed may be manufactured by forming the chip prevention member 6 on the side of the protective layer 4 and then bonding the protective layer 4 to the side of the semiconductor layer 2 by the transparent resin 5'. As in FIGS. 9A to 10, the method of forming the chip prevention member 6 on the side of the semiconductor layer 2 is advantageous in that the chip prevention member 6 is easily brought into contact with the semiconductor layer 2.

Additionally, the present technology may also be configured as below.

(1)
1. A semiconductor device including:
    a semiconductor layer;
    a protective layer including a transparent material; and
    a transparent resin layer that seals a gap between the semiconductor layer and the protective layer,
    wherein a chip prevention member with a higher Young's modulus than the transparent resin layer is formed to come into contact with the semiconductor layer in a dicing portion of a layer structure before fragmentation, and dicing is performed in the dicing portion for the fragmentation.

(2)
The semiconductor device according to (1), wherein the transparent resin layer is interposed between the chip prevention member and the protective layer.

(3)
The semiconductor device according to (1) or (2),
    wherein a width of the chip prevention member before the dicing is set to be in a range of 1.5 times to 3.0 times as large as a thickness B of a dicing blade used to cut the chip prevention member, and
    wherein the width of the chip prevention member after the fragmentation is set to be in a range of (1.5B/2–B/2) to (3B/2–B/2).

(4)
The semiconductor device according to any one of (1) to (3),
    wherein a Young's modulus of the transparent resin layer is set to be equal to or less than 1.5 Gpa, and
    wherein a Young's modulus of the chip prevention member is set to be equal to or greater than 2.5 Gpa.

(5)
The semiconductor device according to any one of (1) to (4), wherein the chip prevention member includes a resin.

(6)
The semiconductor layer according to (5), wherein the chip prevention member includes any of a siloxane-based resin, an acrylic-based resin, and an epoxy-based resin.

(7)
The semiconductor device according to (5) or (6), wherein a resin material of the chip prevention member contains a filler.

(8)
The semiconductor device according to any one of (1) to (7), wherein the protective layer includes glass.

(9)
A method of manufacturing a semiconductor device, the method including:
    forming a layer structure before fragmentation in which a gap between a semiconductor layer and a protective layer including a transparent material is sealed by a transparent resin at a wafer level so that a chip prevention member with a higher Young's modulus than a transparent resin layer is formed to come into contact with the semiconductor layer in a dicing portion for the fragmentation of the semiconductor device; and
    performing dicing on the layer structure before the fragmentation in the dicing portion, which is formed in the step of forming the layer structure before the fragmentation.

The present disclosure contains subject matter related to that disclosed in Japanese Priority Patent Application JP 2012-187927 filed in the Japan Patent Office on Aug. 28, 2012, the entire content of which is hereby incorporated by reference.

What is claimed is:

1. A semiconductor device comprising:
    a semiconductor layer;
    a protective layer including a transparent material; and
    a transparent resin layer that seals a gap between the semiconductor layer and the protective layer, wherein
    a chip prevention member with a higher Young's modulus than the transparent resin layer is formed within the transparent resin layer, positioned to come into continuous contact with the semiconductor layer in a dicing portion of a layer structure before fragmentation, and
    dicing is performed in the dicing portion for the fragmentation.

2. The semiconductor device according to claim 1, wherein the transparent resin layer is interposed between the chip prevention member and the protective layer.

3. The semiconductor device according to claim 1,
    wherein a width of the chip prevention member before the dicing is set to be in a range of 1.5 times to 3.0 times as large as a thickness B of a dicing blade used to cut the chip prevention member, and
    wherein the width of the chip prevention member after the fragmentation is set to be in a range of (1.5B/2 –B/2) to (3B/2–B/2).

4. The semiconductor device according to claim 1,
    wherein a Young's modulus of the transparent resin layer is set to be equal to or less than 1.5 Gpa, and
    wherein a Young's modulus of the chip prevention member is set to be equal to or greater than 2.5 Gpa.

5. The semiconductor device according to claim 1, wherein the chip prevention member includes a resin.

6. The semiconductor layer according to claim 5, wherein the chip prevention member includes any of a siloxane-based resin, an acrylic-based resin, and an epoxy-based resin.

7. The semiconductor device according to claim 5, wherein a resin material of the chip prevention member contains a filler.

8. The semiconductor device according to claim 1, wherein the protective layer includes glass.

9. The semiconductor device according to claim 1, wherein the chip prevention member having a lower surface that is entirely in direct contact with the semiconductor layer in the dicing portion of the layer structure before fragmentation.

* * * * *